United States Patent [19]

Johnstone

[11] Patent Number: 5,520,763

[45] Date of Patent: May 28, 1996

[54] INTELLIGENT FOIL TRANSFER

[75] Inventor: Robert H. Johnstone, Green Bay, Wis.

[73] Assignee: Moore Business Forms, Inc., Grand Island, N.Y.

[21] Appl. No.: 829,247

[22] Filed: Feb. 3, 1992

[51] Int. Cl.[6] .............................. B44C 1/16; B44C 1/17; G03C 3/00

[52] U.S. Cl. .................... 156/233; 156/234; 156/238; 156/239; 156/240

[58] Field of Search ............................... 156/234, 239, 156/240, 233, 238

[56] References Cited

U.S. PATENT DOCUMENTS

| | | | |
|---|---|---|---|
| 2,503,759 | 4/1950 | Murray | 117/37 |
| 3,650,794 | 3/1972 | Steinbach | 117/2 TC |
| 3,995,083 | 11/1976 | Reichle | 428/207 |
| 4,484,970 | 11/1984 | Burzlaff | 156/234 |
| 4,724,026 | 2/1988 | Nelson | 156/234 X |
| 4,770,736 | 9/1988 | Taylor | 156/238 X |
| 4,815,872 | 3/1989 | Nagashima | 400/120 |
| 4,871,408 | 10/1989 | Honma | 156/234 X |
| 4,891,260 | 2/1990 | Kunkel et al. | 428/220 |
| 4,992,129 | 2/1991 | Sasaki | 156/240 |
| 5,002,312 | 3/1991 | Phillips et al. | 283/72 |
| 5,091,738 | 2/1992 | Fulton | 346/154 |
| 5,114,520 | 5/1992 | Wang | 156/234 X |
| 5,147,489 | 9/1992 | Scrutton | 156/240 X |

OTHER PUBLICATIONS

"Acromark Hot Stamping Press Roll On 700 Series" brochure; The Acromark Company, Berkeley Heights, New Jersey; 1989.

"Ion Printing, Past, Present and Future", Fotland, IGC Conference on Ion Deposition Printing, Monterey, CA, Mar. 29-31, 1987.

*Primary Examiner*—David A. Simmons
*Assistant Examiner*—Charles Rainwater
*Attorney, Agent, or Firm*—Nixon & Vanderhye

[57] ABSTRACT

Colored or metallic foil is applied to toner printed onto a substrate, such as paper, in a high speed, versatile manner, using a rotating impression cylinder, and a rotating transfer cylinder having circumferentially spaced heated raised portions. The toner, which preferably includes a thermoplastic component, is applied to the paper with any suitable printer, such as a computer controlled MIDAX (ion deposition) print engine. The toner may be heated by an infra red heater just before the paper is fed to the nip between the impression and transfer cylinders. A foil strip having an adhesive layer facing outwardly, a foil layer, and a release coating on a backing, is also fed to the nip, and the backing taken up downstream of the nip. Heat and pressure applied at the nip transfer the adhesive and foil from the foil strip to the tacky toner, producing the desired foil printed paper, which then may be further processed.

8 Claims, 3 Drawing Sheets

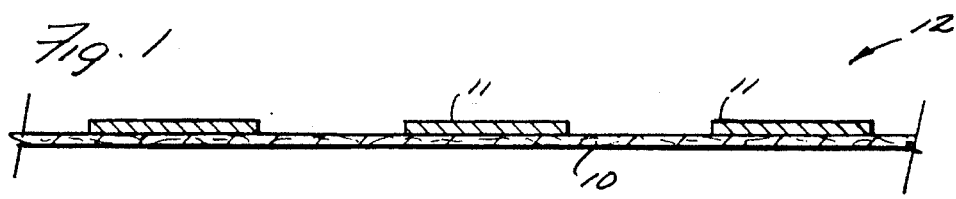
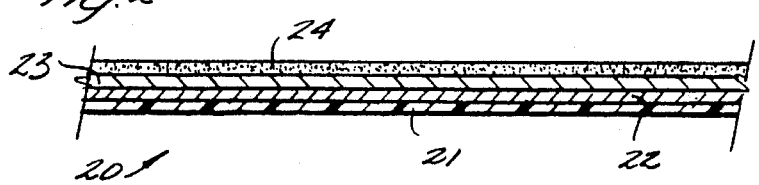
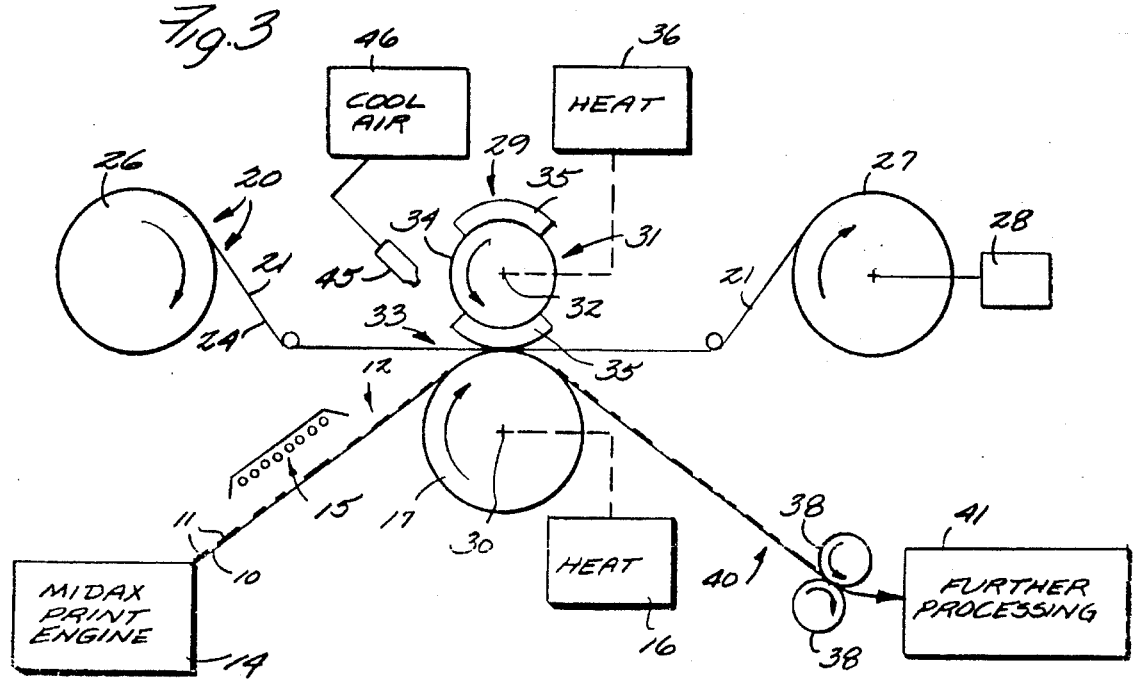
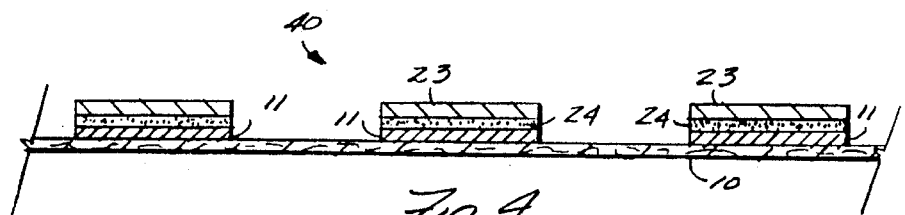

INTELLIGENT FOIL TRANSFER

BACKGROUND AND SUMMARY OF THE INVENTION

There are many circumstances in which it is desired to use colored or metallic foils, including gold, silver, red, and holographic foil materials, on substrates, including in the manufacture of plastic components, and in advertising where printing is desired to be particularly decorative. The present approaches to producing substrates with colored or metallic foil printing thereon is both extremely slow and extremely limited in application. Even with the most effective utilization of conventional equipment, production speeds on the order of only about 20 feet per minute are possible. Even more significantly, however, the images are typically fixed in nature (such as raised plate), or there is only a very limited pattern variation, such as produceable from a numbering machine or the like.

According to the present invention, it is possible for the first time to produce advertising printing or the like with colored or metallic foils at high speed (e.g. about 100 feet per minute or greater), and with almost infinite variety. This is accomplished, according to the invention, by utilizing a computer controlled print engine which prints toner particles on-line, in any desired, variable, pattern (words, images, and/or other indicia), the toner typically having a thermoplastic component. The invention also is accomplished by utilizing a completely rotary approach to effect the transfer of the colored or metallic foil from a foil strip to the substrate, rather than the conventional primarily reciprocal (and thus inherently speed limited) approaches, such as provided in the foil-stamping equipment produced by Kluge of Germany.

The foil utilized in the production of printed substrates according to the invention is conventional foil having a backing or a carrier film, with a release coating thereon, with the foil over the release coating, and a transfer adhesive on the exterior surface of the foil. The adhesive is brought into contact with the toner on the substrate, and by the application of heat and pressure to the foil strip the adhesive and foil are transferred to the toner, having a greater affinity for the toner than the release coating on the backing. The receptability of the toner to the adhesive and foil may be enhanced by heating the toner, as with an infrared heater, just prior to the application of heat and pressure to the foil strip and substrate. If desired this effect can be enhanced further by heating an impression cylinder over which the substrate continuously travels during processing.

Transfer is effected utilizing a transfer cylinder and an impression cylinder. One of the cylinders is of a rigid metal material, while the other is hard rubber or the like (e.g. heated silicone, known per se for this purpose). The transfer cylinder has a plurality of circumferentially spaced heated raised portions, and the transfer cylinder is continuously rotated with the spaced raised heated portions periodically coming into contact with the foil strip and applying pressure at the nip between the transfer cylinder and the impression cylinder. Utilizing this rotary principle, speeds of operation in excess of about 100 feet per minute (e.g. at least about 120 feet per minute, and even as high as about 300 feet per minute) are possible.

The print engine, such as a MIDAX print engine, for applying the toner pattern according to the invention is computer controlled and can provide a virtually infinite variety of variable patterns, including words, images, and/or virtually any type of indicia, on the substrate. The substrate is typically paper, and is typically in web form, although it also may be in sheet form.

According to one aspect of the present invention, a method of producing a printed substrate having colored or metallic foil over at least a part of the printing is provided, comprising the following steps: (a) Printing a desired pattern on a substrate using toner having a thermoplastic component. (b) Continuously feeding the substrate to and past a transfer location. (c) Feeding a foil strip having an outer adhesive layer, a colored or metallic foil layer, and a release coated carrier, to the transfer location, with the adhesive facing the substrate. (d) Heating the toner pattern on the substrate just prior to the transfer location to make the thermoplastic component of the toner receptive to the foil and adhesive layers of the foil strip. And, (e) applying heat to the foil strip, and pressure to the foil strip and substrate, at the transfer location so as to transfer the adhesive and colored or metallic foil onto the heated toner pattern.

Step (a) is preferably practiced by variably printing the pattern utilizing a computer controlled print engine (such as a MIDAX printer), and step (b)—whether the substrate is in web or sheet form—is practiced at a speed of at least about 100 feet per minute.

According to another aspect of the present invention, a similar method is provided comprising the following steps: (a) Variably printing a desired pattern on a substrate using toner. (b) Continuously feeding the substrate to and past a transfer location. (c) Feeding a foil strip having an outer adhesive layer, a colored or metallic foil layer, and a release coated carrier, to the transfer location, with the adhesive facing the substrate. And, (d) applying heat to the foil strip, and pressure to the foil strip and substrate, at the transfer location so as to transfer the adhesive and colored or metallic foil onto the toner pattern, by passing the substrate and foil strip between an impression cylinder and a transfer cylinder, the substrate engaging the impression cylinder. The transfer cylinder preferably has a plurality of circumferentially spaced heated raised surface portions which engage the foil strip, and step (d) is further practiced by continuously rotating the transfer cylinder so that the raised heated surface portions periodically come into contact with the foil strip and exert a pressure on the strip and substrate when they do come into contact, transferring the colored or metallic foil to the printed pattern.

The invention also comprises an apparatus for producing the printed substrate according to the invention. The apparatus comprises: Means for variably printing a predetermined pattern, with toner, on the substrate. An impression cylinder mounted for rotation about a first axis. A transfer cylinder mounted for rotation about a second axis parallel to the first axis, and to define a nip between the impression cylinder and the impression cylinder. Means for continuously feeding the substrate to and past the nip between the transfer cylinder and impression cylinder, with the toner pattern on the substrate facing the transfer cylinder. Means for feeding a foil strip having an adhesive, a foil, and a backing, to the nip with the adhesive and foil facing the impression cylinder. Means for taking up the foil strip backing after passage of the foil strip through the nip. And, means for heating the transfer cylinder to facilitate transfer of the adhesive and foil from the foil strip to the toner pattern on the substrate.

Typically the toner has a thermoplastic component, and the apparatus further comprises means for preheating the toner on the substrate just prior to it entering the nip to render the thermoplastic component tacky. The means for feeding the foil strip to and past the nip and taking up the foil strip backing preferably comprises a stepper motor and motion control driver.

One of the transfer cylinders and impression cylinders is hard, while the other is somewhat deformable. For example, the raised portions of the transfer cylinder are flexible, e.g. of silicone, while the impression cylinder has a rigid metal surface which engages the substrate and which may be heated. The printing means preferably comprises a variable printer such as a computer controlled MIDAX print engine.

It is the primary object of the present invention to provide for the quick and versatile production of printed substrates having colored or metallic foil over at least a part of the printing thereon. This and other objects of the invention will become clear from an inspection of the detailed description of the invention, and from the appended claims.

BRIEF DESCRIPTION OF THE DRAWINGS

FIG. 1 is a side schematic cross-sectional view of a substrate printed with toner as a preliminary to producing the printed substrate according to the invention;

FIG. 2 is a side cross-sectional view of a typical conventional foil strip utilized in the practice of the present invention;

FIG. 3 is a schematic view of exemplary apparatus according to the invention, for producing a printed substrate having colored or metallic foil over at least a part of the printing, according to the invention;

FIG. 4 is a side cross-sectional view of a printed substrate according to the invention;

DETAILED DESCRIPTION OF THE DRAWINGS

Figure 5:
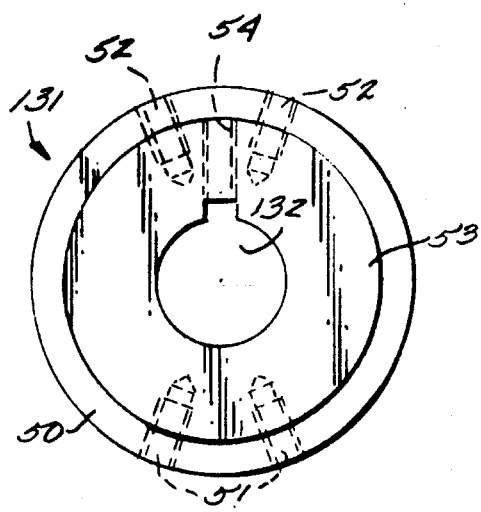
FIG. 5 is an end view of an exemplary transfer roller that may be utilized according to the present invention.

According to the present invention a method and apparatus are provided for quickly producing variable image substrates having colored or metallic foil over portions thereof. The first basic step according to the method of the present invention is to print a substrate, such as a web or sheet of paper 10 (see FIGS. 1 and 3) with toner images 11 in a predetermined pattern, to produce a printed substrate 12. The variable imaging of the toner 11 onto the substrate 10 preferably is accomplished with a computer controlled printer, such as a MIDAX printer (an ion deposition printer), the basic features of which are described in an article entitled "Ion Printing, Past, Present, and Future" by Richard A. Fotland, IGC Conference on Deposition Printing, Monterey, Calif., Mar. 29–31, 1987.

The toner 11 applied by the MIDAX print engine—shown schematically at 14 in FIG. 3—as is known per se, may have a thermoplastic component. A conventional toner for this purpose is Ocè Industries of Chicago, Ill., type "F2". The toner 11 is receptive to conventional foils with transfer adhesives, but may be made even more receptive by heating it just prior to transferring of foil onto the toner 11, and even by heating the substrate 12 as pressure and heat are being applied to a foil strip during transfer. Heating of the toner 11 to render it receptive to the adhesive and foil from a foil strip (typically by rendering the toner 11 tacky) may be accomplished utilizing an infrared pre-heater 15 or the like (see FIG. 3), and by supplying heat—as illustrated schematically at 16—to a rigid metal surface impression cylinder 17 over which the substrate 12 passes, with the toner 11 facing away from the cylinder 17 surface.

A typical foil strip that may be used in producing products according to the invention is illustrated schematically by reference numeral 20 in FIGS. 2 and 3. The foil strip may be as described in U.S. Pat. No. 4,891,260, or one of a wide variety of commercially available foils such as those sold by R. W. Grauert, Inc. of Canton, Conn. under the name "Sparkle Foil". The foil strip 20 includes a carrier film or backing 21, typically of a plastic having substantial integrity, such as Mylar (polyester). The backing 21 is either inherently of release material, or has a release coating 22 (see FIG. 2), such as of silicone, polytetrafluoroethylene, or another highly lubricious material. Next to the release coating 22 is the foil material 23, which may be of any conventional form, including colored or metallic foils or the like (e.g. silver, gold, red, holographic, etc.). On the opposite side of the foil material 23 is a transfer adhesive 24. The foil material 23 has a much higher affinity to the transfer adhesive 24 than it does to the release coating 22, therefore when heat and pressure are applied to the backing 21 and the adhesive material 24 engages a receptive material (such as the toner 11 images), the adhesive 24 and foil material 23 will transfer to the receptive material where (but only where) it is located.

The foil strip 20—for the embodiment illustrated in FIG. 3—is fed utilizing an unlined roll 26 or the like, and a take-up roll 27 or the like. The take-up roll 27 takes up the backing 21 (with release coating 22), as well as any adhesive or foil 24, 23, respectively not transferred to the toner 11 images. The means for let-off and take up of the foil strip 20 include, in addition to the rolls 26, 27, means for controlling the tension and feed-to-length parameters of the foil strip 20, such as the stepper motor and motion control driver illustrated schematically by reference numeral 28 in FIG. 3.

Transfer of the foil 23 to the toner 11 is provided at a transfer station, shown schematically by reference numeral 29 in FIG. 3. The impression cylinder 17 is located at transfer station 29 and rotatable about an axis 30 (typically horizontal), as is a transfer cylinder 31, shown schematically in FIG. 3. The transfer cylinder 31 is rotatable about an axis 32, typically a horizontal axis parallel to the axis 30, and a nip, shown generally by reference numeral 33, is defined between the cylinders 17, 31.

The transfer cylinder 31 may have a basic surface 34, from which raised flexible (deformable) heated circumferentially spaced arcuate surface portions 35 extend. The surface portions 35 are heated from heat source 36, which may be an external infrared heat source, or an internal heat source. The portions 35 may comprise a flexible material such as silicone. The utilization of silicone on a roller is known per se, such as in the Acromark 700 hot stamping press (manufactured by Acromark 700 Company, Inc. of Berkeley Heights, N.J.). The roller 31 is typically substantially continuously rotated, but pressure (and heat) sufficient to effect transfer of the adhesive 24 and foil 23 to the toner 11 of the substrate 12 is effected only when the spaced arcuate surface portions 35 form a part of the nip 33, applying substantial pressure.

The impression cylinder and transfer cylinder may have the materials thereof reversed. That is, if the transfer cylinder 31 is flexible, the impression cylinder 17 is rigid, and vice versa.

The substrate 12 is continuously fed to the nip 33 of the transfer station 29, and past it, as by utilizing the feed rolls 38 (see FIG. 3), and like other rolls (not shown in FIG. 3). While the substrate 12 is shown in web form in FIG. 3, it is to be understood that individual sheets could be essentially continuously fed to the station 29 utilizing conventional sheet feeding equipment.

After processing at the transfer station 29, the final substrate—illustrated generally by reference numeral 40 in FIGS. 3 and 4—may pass to further processing stages (illustrated schematically at 41 in FIG. 3). During further operations the substrate 40 could be additionally printed, slit, folded, collated, packaged, and otherwise processed.

The final product 40 produced according to the invention, as seen in FIG. 4, includes the substrate 10 and toner images 11, with the transfer adhesive 24 between the toner images 11 and the colored or metallic (e.g. gold, silver, red, holographic, etc.) foil 23 visible by one looking at the product 40.

Because the components of the apparatus of FIG. 3 are rotary in nature, and do not rely upon an inherently slow reciprocation action, the product 40 can be produced at speeds in excess of 100 feet per minute, e.g. about 120 feet per minute, and even as high as 300 feet per minute. Because variable toner images 11 are applied to the substrate 10, the product 40 according to the invention also has enormously greater versatility than prior art processes and products, which require a substantially fixed image, or limited pattern variation such as produced by a number machine.

In final form the apparatus according to the invention, schematically illustrated in FIG. 3, may include many accessory components not essential to the basic features of the invention. For example a nozzle 45, or like means, connected up to a cool air source 46, may be provided for directing a blast a cooling air toward the transfer cylinder 31 during interruption of the method steps for producing the product 40. Also, the cylinder 31 could be controlled by Servo motion control technology, the raised portions 35 may be in the form of pads which may be removed from and repositioned on the surface 34 as desired for a particular product 40 being produced, closed loop temperature control may be provided for both the pre-heat apparatus 15 and the cylinders 31, 17, and various other structures may be utilized for supporting the non-transfer portions 34 of the roller 31 during normal operation cycles, and for supplying cooling water for the heating equipment. The details of such components are not important to the basic functionality of the apparatus of FIG. 3, or for the basic methods according to the invention.

According to an exemplary method of producing a printed substrate 40, having colored or metallic foil over at least a part of the printing, according to the invention, the following steps are followed:

Printing a desired pattern on a substrate 10 utilizing the toner 11, such as variably printing the toner images 11 utilizing a MIDAX (ion deposition) print engine 14, with the toner having a thermoplastic component.

Continuously feeding the substrate 10 to and past the transfer location 29, as with the rollers 38. This may be practiced at speeds in excess of 100 feet per minute.

Feeding the foil strip 20 having an outer adhesive layer 24, a colored or metallic foil layer 23, and a release (22) coated carrier (backing 21) to the transfer location 29 with the adhesive 24 facing the substrate 12. This is accomplished utilizing the apparatus 26–28.

Where the toner 11 images have a thermoplastic component, applying heat to the toner pattern 11 on the substrate 12 just prior to the transfer location 29 (e.g. with I.R. heater 15) to make the thermoplastic component of the toner receptive to the foil and adhesive layers 23, 24 of the foil strip 20 (rendering the toner images 11 tacky).

Applying heat to the foil strip 20, and pressure to the foil strip 20 and substrate 12, at the transfer location 29, so as to transfer the adhesive 24 and colored or metallic foil 23 onto the heated toner pattern 11.

Transfer at transfer station 29 is accomplished in a rotary manner, by continuously rotating the impression cylinder 17 and transfer cylinder 31, with transfer taking place only when the raised heated surface portions 35 circumferentially spaced along the surface 34 engage the strip 20 at the nip 33, applying transfer pressure.

The final product 40 produced may be passed to further processing stages, as illustrated schematically at 41 in FIG. 3.

Figure 6:
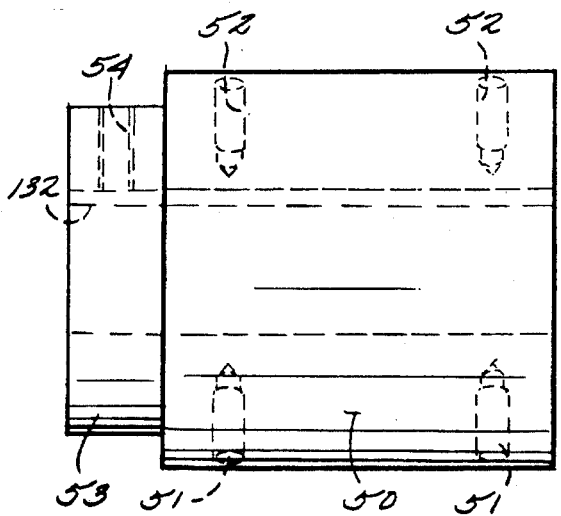
FIG. 6 is a side view of the transfer roller of FIG. 5.
Figure 7:
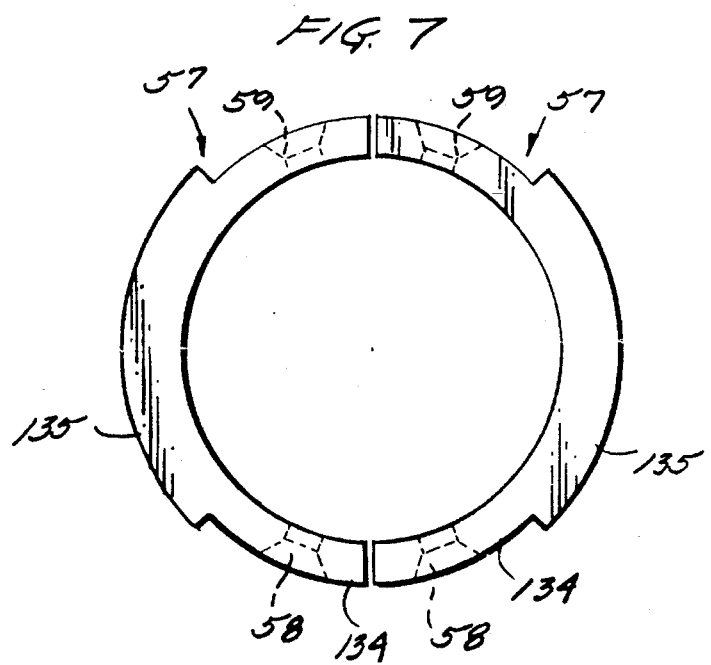
FIG. 7 is an end view of a sleeve for the transfer roller of FIGS. 5 and 6 providing raised portions thereof.

While the transfer roller 31 according to the present invention may take a wide variety of forms, one form that may be desirable, and allows for easy replacement of different configurations of raised surfaces, is illustrated in FIGS. 5 through 7. In FIGS. 5 through 7 structures comparable to those in the FIG. 3 embodiment are shown by the same reference numeral only preceded by a "1".

The transfer roller 131 has an interior portion 132 thereof that is keyed to a shaft driven by a conventional drive unit. The roller 131 may be of a polymeric material (which will withstand the approximately 500° F. temperature that the system is normally exposed to), with generally radially extending openings 51, 52 being provided therein for receipt of fasteners for connecting the sleeve (shown in FIG. 7 and to be further described hereafter) to the roller 131 main body 50. The roller 131 also includes a concentric extension 53, which has a radial passage 54 therein for receipt of a fastener that facilitates attachment of the roller 131 to a shaft.

A sleeve for placing around the roller 131 body 50, and having substantially the same axial length as the body 50, is shown by the two segments 57 illustrated in FIG. 7. The sleeve illustrated in FIG. 7 may be of one-piece construction, but the two-piece construction 57 illustrated in FIG. 7 is preferred. Each segment 57 has generally radially extending holes 58, 59 therein for cooperation, respectively, with the holes 51, 52 in the roller 131 main body 50, so that each segment 57 is connected at four points by fasteners to the roller 131. The segments 57 may be of aluminum, or the like. The segments 57 provide the recessed circumferential portion 134, and the raised, transfer, portions 135. A plurality of different sets of segments 57 can be provided having different arcuate lengths, the raised portions 135, or having a different number and spacing of the raised portions 135.

Figure 8:
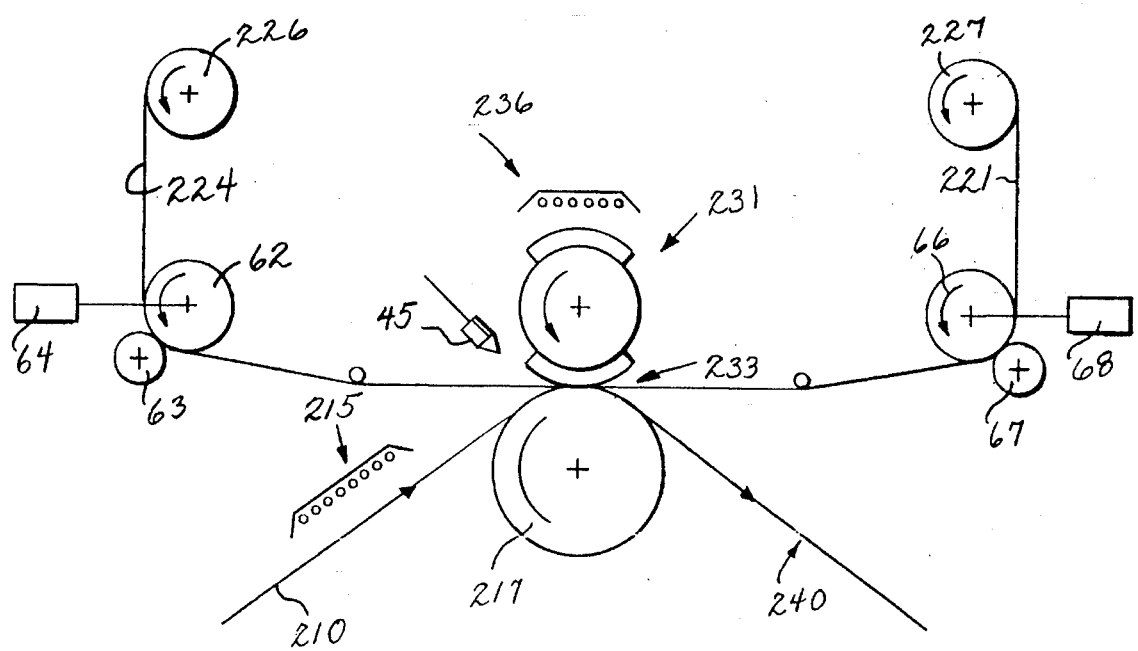
FIG. 8 is a schematic view of a second exemplary embodiment of apparatus according to the present invention.

FIG. 8 is a schematic illustration of a system similar to that illustrated in FIG. 3, but with a few differences, primarily with respect to the foil let off and take up arrangement. In the FIG. 8 embodiment structures comparable to those in the FIG. 3 embodiment are shown by the same two digit reference numeral only preceded by a "2".

In the FIG. 8 embodiment, maximum flexibility is provided in the production of the desired end product by effectively providing "one size fits all" (almost) from the print length point of view. The velocity of the transfer roller 231 is profiled during the process cycle and also triggers an output to start the foil feed 224 at a selected point in the profile. For the foil feed two sets of structures, 62–64 disposed between the foil unwind 226 and the transfer cylinder 231, and structure 66–68, disposed between the foil take up 227 and the transfer cylinder 231, are provided. The assembly 62–64 precisely controls the foil feed to the nip 233 utilizing a main roller 62 and a rider roller 63, the main roller 62 being driven by a stepper motor 64 and programmed control system. The system 66–68 is another intermittent feed system, like the system 62–64, but rather utilizes a drive which provides a constant pull that can be stalled. That is, the drive roller 66 and rider roller 67 cooperate to take up the web 221 with the roller 66 driven by an electrical or pneumatic "torque" or "stall" motor 68 with associated control system. The motor 68 "torque" or "stall" function is provided, for example, by an air motor whose velocity, and torque, is controlled by the air pressure supplied to it, which can be proportional to the process speed to allow increase of the pull station speed as the press speed increases.

Note that in the FIG. 8 embodiment the heat for the transfer cylinder system 231 is provided by an infrared heat source 236, and if the transfer cylinder 231 has the construction illustrated in FIGS. 5 through 7, the impression cylinder 217 is of deformable material (e.g., silicone). In both the FIG. 8 and FIG. 3 embodiments, the tension and feed-to-length parameters of the foil strip are controlled.

It will thus be seen that according to the present invention a fast yet versatile process, and apparatus for practicing the process, have been provided for producing printed substrates having colored or metallic foil over at least a part of the printing thereof. While the invention has been herein shown and described in what is presently conceived to be the most practical and preferred embodiment it will be apparent to those of ordinary skill in the art that many modifications may be made thereof within the scope of the invention, which scope is to be accorded the broadest interpretation of the appended claims so as to encompass all equivalent methods and apparatus.

What is claimed is:

1. A method of producing a printed substrate having colored or metallic foil over at least a part of the printing, comprising the steps of:
   (a) printing a desired pattern on a substrate using toner having a thermoplastic component capable of being rendered receptive;
   (b) continuously feeding the substrate to, through and past a transfer location;
   (c) feeding a foil strip having an outer adhesive layer, a colored or metallic foil layer, and a release coated carrier, to the transfer location, with the adhesive facing the substrate;
   (d) heating the toner pattern on the substrate just prior to the substrate entering the transfer location to make the component thereof capable of being receptive to the foil and adhesive layers of the foil strip;
   (e) applying heat to the foil strip, and pressure to the foil strip and substrate, at the transfer location so as to transfer the adhesive and colored or metallic foil onto the heated toner pattern;
   (f) practicing step (a) by variably printing the patterns utilizing a computer controlled ion deposition print engine;
   (g) practicing step (b) at a speed of at least about 100 feet/minute; and
   (h) practicing step (a) by moving the substrate as a web continuously to and past the transfer station.

2. A method as recited in claim 1 wherein the toner has a thermoplastic component, and wherein step (d) is practiced by continuously applying heat to the toner.

3. A method as recited in claim 1 wherein the transfer location includes an impression cylinder and a transfer cylinder; and wherein step (e) is practiced by passing the substrate and foil strip between the impression cylinder and transfer cylinder, the substrate engaging the impression cylinder.

4. A method as recited in claim 3 wherein step (e) is further practiced by continuously applying heat to the substrate at the transfer location by heating the impression cylinder.

5. A method as recited in claim 3 wherein the transfer cylinder has a plurality of circumferentially spaced arcuate heated raised surface portions which engage the foil strip; and wherein step (e) is further practiced by continuously rotating the transfer cylinder so that the raised heated surface portions thereof periodically come into contact with the foil strip and exert a pressure on the foil strip and substrate when they do come into contact with the foil strip, transfer of colored or metallic foil to the printed pattern occurring only when the raised heated surface portions come into contact with the foil strip.

6. A method as recited in claim 5 utilizing a foil strip let off and foil strip take-up; and wherein step (c) is practiced by controlling the tension and feed-to-length parameters of the foil strip.

7. A method as recited in claim 3 comprising the further step of directing a blast of cooling air toward the transfer cylinder during interruption of the method steps.

8. A method of producing a printed substrate having colored or metallic foil over at least a part of the printing, and utilizing a transfer location including an impression cylinder and a transfer cylinder, comprising the steps of:
   (a) variably printing a desired pattern on a substrate using toner;
   (b) continuously feeding the substrate to, through and past a transfer location;
   (c) feeding a foil strip having an outer adhesive layer, a colored or metallic foil layer, and a release coated carrier, to the transfer location, with the adhesive facing the substrate;
   (d) applying heat to the foil strip, and pressure to the foil strip and substrate, at the transfer location so as to transfer the adhesive and colored or metallic foil onto the toner pattern, by passing the substrate and foil strip between the impression cylinder and transfer cylinder, the substrate engaging the impression cylinder;
   (e) practicing step (a) by utilizing a computer controlled ion deposition print engine;
   (f) practicing step (b) at a speed of at least about 100 feet/minute;
   (g) practicing step (a) by feeding the substrate as a web to and past the transfer station;
   the transfer cylinder having a plurality of circumferentially spaced arcuate heated raised surface portions which engage the foil strip; and
   wherein step (d) is further practiced by continuously rotating the transfer cylinder so that the raised heated surface portions thereof periodically come into contact with the foil strip and exert a pressure on the foil strip and substrate when they do come into contact with the foil strip, transfer of colored or metallic foil to the printed pattern occurring only when the raised heated surface portions come into contact with the foil strip.

* * * * *